(12) United States Patent
Araki et al.

(10) Patent No.: US 10,224,267 B2
(45) Date of Patent: Mar. 5, 2019

(54) SEMICONDUCTOR DEVICE

(71) Applicant: Mitsubishi Electric Corporation, Tokyo (JP)

(72) Inventors: Shintaro Araki, Tokyo (JP); Mitsunori Aiko, Tokyo (JP); Takaaki Shirasawa, Tokyo (JP); Khalid Hassan Hussein, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 1 day.

(21) Appl. No.: 14/893,266

(22) PCT Filed: Jul. 16, 2013

(86) PCT No.: PCT/JP2013/069311
§ 371 (c)(1),
(2) Date: Nov. 23, 2015

(87) PCT Pub. No.: WO2015/008333
PCT Pub. Date: Jan. 22, 2015

(65) Prior Publication Data
US 2016/0126168 A1 May 5, 2016

(51) Int. Cl.
*H01L 23/495* (2006.01)
*H01L 23/31* (2006.01)
(Continued)

(52) U.S. Cl.
CPC .... *H01L 23/49568* (2013.01); *H01L 23/3114* (2013.01); *H01L 23/49537* (2013.01);
(Continued)

(58) Field of Classification Search
CPC ............... H01L 29/7395; H01L 29/749; H01L 29/1095; H01L 29/7455; H01L 29/0834
See application file for complete search history.

(56) References Cited

U.S. PATENT DOCUMENTS 5,608,595 A   3/1997 Gourab et al.
5,956,231 A   9/1999 Yamada et al.
(Continued)

FOREIGN PATENT DOCUMENTS

JP   H07-297358 A   11/1995
JP   H08-186193 A   7/1996
(Continued)

OTHER PUBLICATIONS

International Search Report, PCT/JP2013/069311 dated Oct. 8, 2013.
(Continued)

*Primary Examiner* — Kenneth Parker
*Assistant Examiner* — Long H Le
(74) *Attorney, Agent, or Firm* — Studebaker & Brackett PC

(57) ABSTRACT

A first switching element and a second switching element are thermally connected to each other since the first switching element and the second switching element are fixed on a second substrate. An upper arm is capable of increasing the current capacity of the semiconductor device because of the parallel connection of the first switching element and the second switching element. The lower arm is capable of increasing the current capacity of the semiconductor device because of the parallel connection of the first switching element and the second switching element.

6 Claims, 16 Drawing Sheets

(51) Int. Cl.
*H01L 25/07* (2006.01)
*H01L 25/18* (2006.01)
*H02M 7/00* (2006.01)
*H01L 23/00* (2006.01)

(52) U.S. Cl.
CPC ........ *H01L 23/49562* (2013.01); *H01L 24/36* (2013.01); *H01L 24/40* (2013.01); *H01L 25/07* (2013.01); *H01L 25/18* (2013.01); *H02M 7/003* (2013.01); *H01L 2224/40137* (2013.01); *H01L 2924/13055* (2013.01); *H01L 2924/13091* (2013.01); *H01L 2924/181* (2013.01)

(56) References Cited

U.S. PATENT DOCUMENTS

| | | | | |
|---|---|---|---|---|
| 6,101,114 | A * | 8/2000 | Kijima | H02M 7/003 363/132 |
| 2002/0130402 | A1 * | 9/2002 | Usami | G06K 19/07786 257/678 |
| 2005/0024805 | A1 * | 2/2005 | Heilbronner | H01L 24/49 361/100 |
| 2007/0216013 | A1 * | 9/2007 | Funakoshi | H01L 23/3735 257/691 |
| 2009/0057929 | A1 * | 3/2009 | Sasaki | H01L 23/3107 257/796 |
| 2010/0208427 | A1 | 8/2010 | Horiuchi et al. | |
| 2010/0213915 | A1 * | 8/2010 | Kora | H03K 17/08142 323/290 |
| 2012/0112366 | A1 | 5/2012 | Crebier | |

FOREIGN PATENT DOCUMENTS

| | | |
|---|---|---|
| JP | 2004-193476 A | 7/2004 |
| JP | 2006-324595 A | 11/2006 |
| JP | 2007-012722 A | 1/2007 |
| JP | 2009-059887 A | 3/2009 |
| JP | 2010-192708 A | 9/2010 |
| JP | 2012-533268 A | 12/2012 |

OTHER PUBLICATIONS

Notification of Transmittal of Translation of the International Preliminary Report on Patentability and Translation of Written Opinion of the International Searching Authority; PCT/JP2013/069311 dated Jan. 28, 2016.

An Office Action issued by the Chinese Patent Office dated Aug. 16, 2017, which corresponds to Chinese Patent Application No. 201380078314.7 and is related to U.S. Appl. No. 14/893,266; with English translation.

An Office Action issued by the German Patent Office dated Apr. 3, 2018, which corresponds to German Patent Application No. 112013007243.2 and is related to U.S. Appl. No. 14/893,266; with English translation.

* cited by examiner

SEMICONDUCTOR DEVICE

TECHNICAL FIELD

This invention relates to a semiconductor device used, for example, for large-current switching.

BACKGROUND ART

Patent Literature 1 discloses a semiconductor device having an arm (bridge arm) formed by two switching elements connected in series. An intermediate point between the two switching elements is connected to an output terminal connected to a load. A plurality of the arms are used to form circuits such as a chopper circuit, an inverter circuit, or a rectifier.

PRIOR ART

Patent Literature

Patent Literature 1: National publication of translated version No. 2012-533268

SUMMARY OF INVENTION

Technical Problem

When switching elements are connected in parallel with each other for the purpose of increasing the current capacity of a semiconductor device, temperature variation can occur between the switching elements due to current unbalance between the switching elements. There is a need to make uniform the characteristics of the switching elements connected in parallel with each other in order to limit the temperature variation. Making uniform the characteristics of the switching elements connected in parallel entails a problem that the number of points of management of the characteristics of the semiconductor device is increased.

The present invention has been achieved to solve the above-described problem, and an object of the present invention is to provide a semiconductor device capable of increasing its current capacity without increasing the number of points of management of its characteristics.

Means for Solving the Problems

A semiconductor device of the claimed invention includes a first substrate formed of an electric conductor, a first diode having a first cathode electrode and a first anode electrode, the first cathode electrode being electrically connected to the first substrate, a second substrate formed of an electric conductor, a first switching element having a first emitter electrode, a first collector electrode and a first gate electrode, the first collector electrode being electrically connected to the second substrate, a second switching element having a second emitter electrode, a second collector electrode and a second gate electrode, the second collector electrode being electrically connected to the second substrate, a first terminal electrically connected to the second substrate, a second terminal electrically connected to the first anode electrode, a third terminal electrically connected to the first emitter electrode, the second emitter electrode and the first substrate, and a molding resin covering the first substrate, the first diode, the second substrate, the first switching element and the second switching element while exposing portions of the first terminal, the second terminal and the third terminal to the outside.

A semiconductor device of another claimed invention includes a first substrate formed of an electric conductor, a first diode having a first cathode electrode and a first anode electrode, the first cathode electrode being electrically connected to the first substrate, a second diode having a second cathode electrode and a second anode electrode, the second cathode electrode being electrically connected to the first substrate, a second substrate formed of an electric conductor, a first switching element having a first emitter electrode, a first collector electrode and a first gate electrode, the first collector electrode being electrically connected to the second substrate, a first terminal electrically connected to the second substrate, a second terminal electrically connected to the first anode electrode and the second anode electrode, a third terminal electrically connected to the first emitter electrode and the first substrate, and a molding resin covering the first substrate, the first diode, the second diode, the second substrate and the first switching element while exposing portions of the first terminal, the second terminal and the third terminal to the outside.

A semiconductor device of another claimed invention includes a first substrate formed of an electric conductor, a first diode having a first cathode electrode and a first anode electrode, the first cathode electrode being electrically connected to the first substrate, a second diode having a second cathode electrode and a second anode electrode, the second cathode electrode being electrically connected to the first substrate, a second substrate formed of an electric conductor, a first switching element having a first emitter electrode, a first collector electrode and a first gate electrode, the first collector electrode being electrically connected to the second substrate, a first terminal electrically connected to the first substrate, a second terminal electrically connected to the first emitter electrode, a third terminal electrically connected to the second substrate, the first anode electrode and the second anode electrode, and a molding resin covering the first substrate, the first diode, the second diode, the second substrate and the first switching element while exposing portions of the first terminal, the second terminal and the third terminal to the outside.

A semiconductor device of another claimed invention includes a first substrate formed of an electric conductor, a first diode having a first cathode electrode and a first anode electrode, the first cathode electrode being electrically connected to the first substrate, a second substrate formed of an electric conductor, a first switching element having a first emitter electrode, a first collector electrode and a first gate electrode, the first collector electrode being electrically connected to the second substrate, a second switching element having a second emitter electrode, a second collector electrode and a second gate electrode, the second collector electrode being electrically connected to the second substrate, a first terminal electrically connected to the first substrate, a second terminal electrically connected to the first emitter electrode and the second emitter electrode, a third terminal electrically connected to the second substrate and the first anode electrode, and a molding resin covering the first substrate, the first diode, the second substrate, the first switching element and the second switching element while exposing portions of the first terminal, the second terminal and the third terminal to the outside.

A semiconductor device of another claimed invention includes a first semiconductor device including, a first substrate formed of an electric conductor, a first diode having a first cathode electrode and a first anode electrode, the first cathode electrode being electrically connected to the first substrate, a second substrate formed of an electric conductor, a first switching element having a first emitter electrode, a first collector electrode and a first gate electrode, the first collector electrode being electrically connected to the second substrate, a second switching element having a second emitter electrode, a second collector electrode and a second gate electrode, the second collector electrode being electrically connected to the second substrate, a first terminal electrically connected to the second substrate, a second terminal electrically connected to the first anode electrode, a third terminal electrically connected to the first emitter electrode, the second emitter electrode and the first substrate, and a molding resin covering the first substrate, the first diode, the second substrate, the first switching element and the second switching element while exposing portions of the first terminal, the second terminal and the third terminal to the outside. The semiconductor device further includes a second semiconductor device including a third substrate formed of an electric conductor, a third diode having a third cathode electrode and a third anode electrode, the third cathode electrode being electrically connected to the third substrate, a fourth diode having a fourth cathode electrode and a fourth anode electrode, the fourth cathode electrode being electrically connected to the third substrate, a fourth substrate formed of an electric conductor, a third switching element having a third emitter electrode, a third collector electrode and a third gate electrode, the third collector electrode being electrically connected to the fourth substrate, a fourth terminal electrically connected to the third substrate, a fifth terminal electrically connected to the third emitter electrode, a sixth terminal electrically connected to the fourth substrate, the third anode electrode and the fourth anode electrode, and a molding resin covering the third substrate, the third diode, the fourth diode, the fourth substrate and the third switching element while exposing portions of the fourth terminal, the fifth terminal and the sixth terminal to the outside. The semiconductor device further includes a cooling device on which the first semiconductor device and the second semiconductor device are mounted. The first terminal is correctly opposed to the fourth terminal, the second terminal is correctly opposed to the fifth terminal, and the third terminal is correctly opposed to the sixth terminal.

A semiconductor device of another claimed invention includes a first semiconductor device including a first substrate formed of an electric conductor, a first diode having a first cathode electrode and a first anode electrode, the first cathode electrode being electrically connected to the first substrate, a second diode having a second cathode electrode and a second anode electrode, the second cathode electrode being electrically connected to the first substrate, a second substrate formed of an electric conductor, a first switching element having a first emitter electrode, a first collector electrode and a first gate electrode, the first collector electrode being electrically connected to the second substrate, a first terminal electrically connected to the second substrate, a second terminal electrically connected to the first anode electrode and the second anode electrode, a third terminal electrically connected to the first emitter electrode and the first substrate, and a molding resin covering the first substrate, the first diode, the second diode, the second substrate and the first switching element while exposing portions of the first terminal, the second terminal and the third terminal to the outside. The semiconductor device further includes a second semiconductor device including a third substrate formed of an electric conductor, a third diode having a third cathode electrode and a third anode electrode, the third cathode electrode being electrically connected to the third substrate, a fourth substrate formed of an electric conductor, a second switching element having a second emitter electrode, a second collector electrode and a second gate electrode, the second collector electrode being electrically connected to the fourth substrate, a third switching element having a third emitter electrode, a third collector electrode and a third gate electrode, the third collector electrode being electrically connected to the fourth substrate, a fourth terminal electrically connected to the third substrate, a fifth terminal electrically connected to the second emitter electrode and the third emitter electrode, a sixth terminal electrically connected to the fourth substrate and the third anode electrode, and a molding resin covering the third substrate, the third diode, the fourth substrate, the second switching element and the third switching element while exposing portions of the fourth terminal, the fifth terminal and the sixth terminal to the outside. The semiconductor device further includes a cooling device on which the first semiconductor device and the second semiconductor device are mounted. The first terminal is correctly opposed to the fourth terminal, the second terminal is correctly opposed to the fifth terminal, and the third terminal is correctly opposed to the sixth terminal.

Other features of the present invention will become clear from the following description.

Advantageous Effect of Invention

According to this invention, the current capacity of the semiconductor device can be increased without increasing the number of points of management of the characteristics of the semiconductor device.

DESCRIPTION OF EMBODIMENTS

Figure 1:
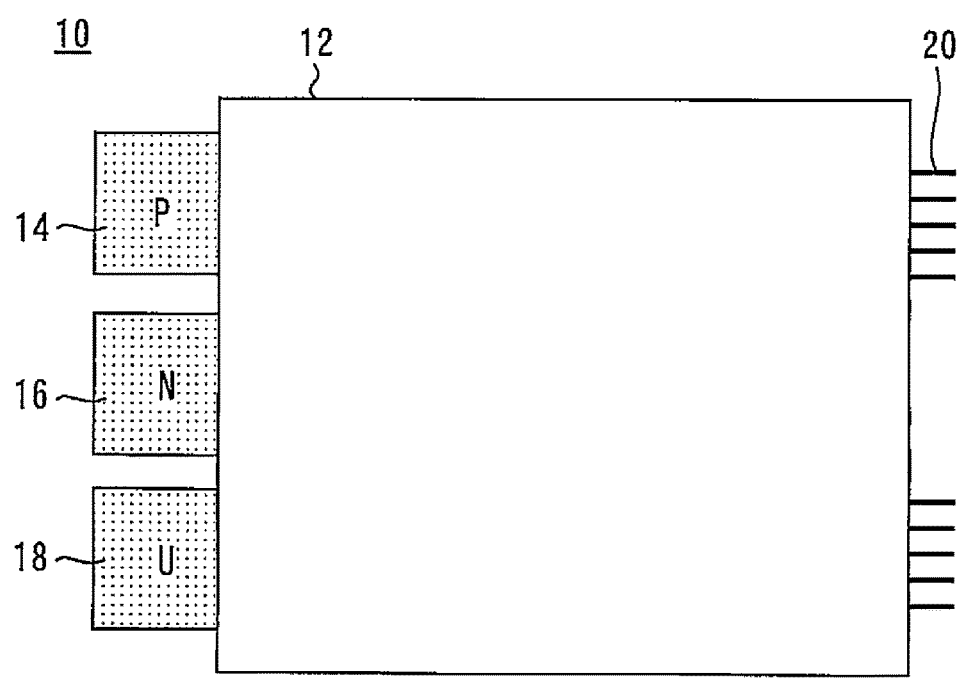
FIG. 1 is a plan view of a semiconductor device according to Embodiment 1 of the present invention.

A semiconductor device according to an embodiment of the present invention will be described with reference to the drawings. Components identical or corresponding to each other are assigned the same reference characters and repeated description of them is omitted in some cases.

Embodiment 1

FIG. 1 is a plan view of a semiconductor device 10 according to Embodiment 1 of the present invention. The semiconductor device 10 is provided with a molding resin 12. A first terminal 14, a second terminal 16, a third terminal 18 and control terminals 20 are exposed from the molding resin 12 to the outside. "P" is affixed to the first terminal 14 because the first terminal 14 is connected to the positive side (P-side) of a power supply. "N" is affixed to the second terminal 16 because the second terminal 16 is connected to the negative side (N-side) of the power supply. "U" is affixed to the third terminal 18 because the third terminal 18 is connected to a U-phase bus bar.

Figure 2:
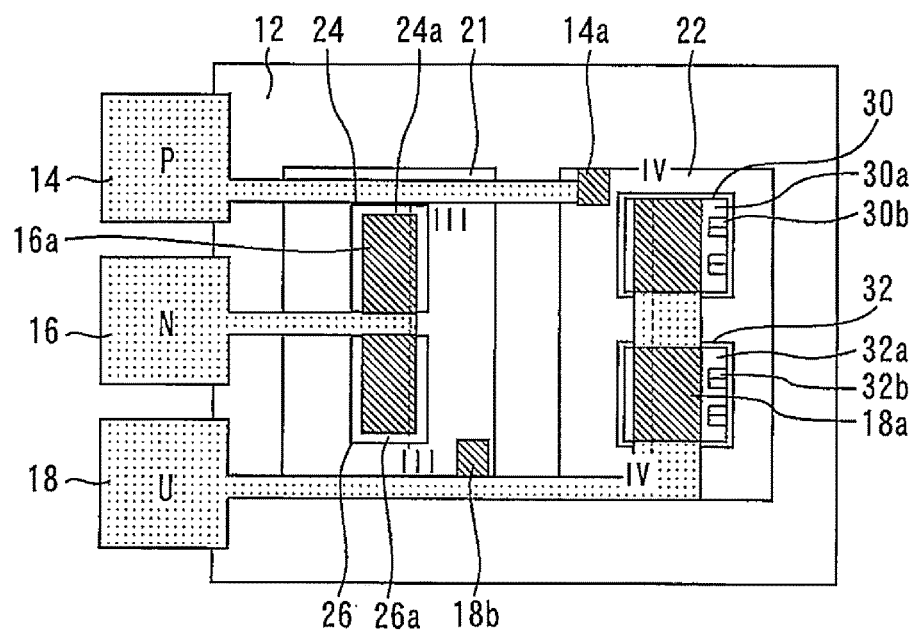
FIG. 2 is a plan view showing portions in the molding resin shown in FIG. 1.

FIG. 2 is a plan view showing portions in the molding resin 12 shown in FIG. 1. The semiconductor device 10 includes a first substrate 21 formed of an electric conductor and a second substrate 22 formed of an electric conductor. A first diode 24 and a second diode 26 are mounted on the first substrate 21.

Figure 3:
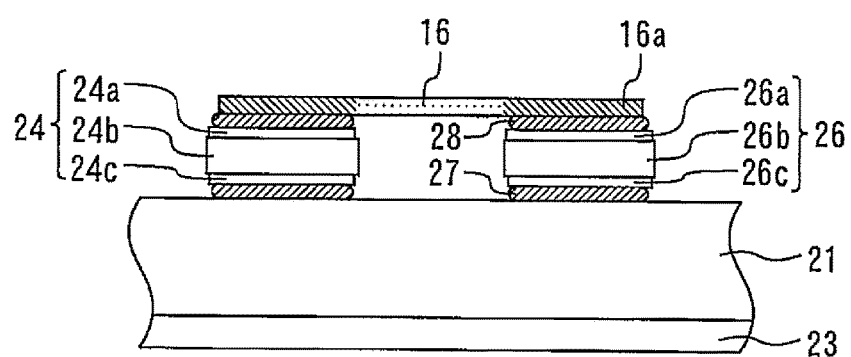
FIG. 3 is a sectional view taken along broken line III-III in FIG. 2.

FIG. 3 is a sectional view taken along broken line III-III in FIG. 2. The first diode 24 has a first anode electrode 24a, a substrate 24b and a first cathode electrode 24c. The second diode 26 has a second anode electrode 26a, a substrate 26b and a second cathode electrode 26c.

The first cathode electrode 24c and the second cathode electrode 26c are electrically connected to the first substrate 21 by an electroconductive adhesive 27, e.g., solder. The first anode electrode 24a and the second anode electrode 26a are electrically connected to a connection portion 16a of the second terminal 16 by an electroconductive adhesive 28. The connection portion 16a is a portion of the second terminal 16 formed right above the first anode electrode 24a and the second anode electrode 26a. An insulating sheet 23 is attached to a lower surface of the first substrate 21. A lower surface of the insulating sheet 23 is exposed from the molding resin 12 to the outside.

Referring back to FIG. 2, a first switching element 30 and a second switching element 32 are mounted on the second substrate 22. Each of the first switching element 30 and the second switching element 32 is formed of an IGBT. The first switching element 30 has a first emitter electrode 30a and a first gate electrode 30b on its upper surface side. The second switching element 32 has a second emitter electrode 32a and a second gate electrode 32b on its upper surface side.

Figure 4:
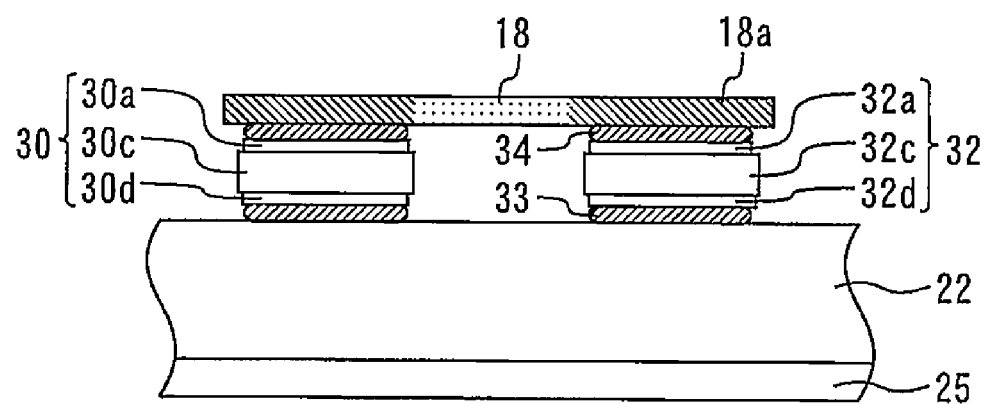
FIG. 4 is a sectional view taken along broken line IV-IV in FIG. 2.

FIG. 4 is a sectional view taken along broken line IV-IV in FIG. 2. The first switching element 30 has a substrate 30c and a first collector electrode 30d formed on the lower surface side of the substrate 30c. The second switching element 32 has a substrate 32c and a second collector electrode 32d formed on the lower surface side of the substrate 32c. The first collector electrode 30d and the second collector electrode 32d are electrically connected to the second substrate 22 by an electroconductive adhesive 33.

The first emitter electrode 30a and the second emitter electrode 32a are electrically connected to a connection portion 18a of the third terminal 18 by an electroconductive adhesive 34. The connection portion 18a is a portion of the third terminal 18 formed right above the first emitter electrode 30a and the second emitter electrode 32a. An insulating sheet 25 is attached to a lower surface of the second substrate 22. A lower surface of the insulating sheet 25 is exposed from the molding resin 12 to the outside.

Referring back to FIG. 2, a connection portion 14a of the first terminal 14 is electrically connected to the second substrate 22 by an electroconductive adhesive. The connection portion 14a is a portion of the first terminal 14 formed right above the second substrate 22. A connection portion 18b of the third terminal 18 is electrically connected to the first substrate 21 by an electroconductive adhesive. The connection portion 18b is a portion of the third terminal 18 formed right above the first substrate 21. The connection portion 18a is connected to the first emitter electrode 30a and to the second emitter electrode 32a, and the connection portion 18b is connected to the first substrate 21. The third terminal 18 is thereby connected electrically to the first emitter electrode 30a, the second emitter electrode 32a and the first substrate 21.

The molding resin 12 covers the first substrate 21, the first diode 24, the second diode 26, the second substrate 22, the first switching element 30 and the second switching element 32 while exposing portions of the first terminal 14, the second terminal 16 and the third terminal 18 to the outside. Illustration of the control terminals 20 is omitted in FIG. 2 for ease of explanation.

Figure 5:
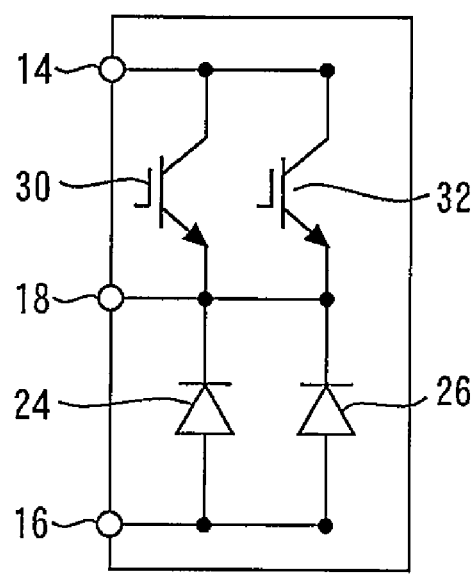
FIG. 5 is a circuit diagram of the semiconductor device.

FIG. 5 is a circuit diagram of the semiconductor device 10. The first switching element 30 and the second switching element 32 are connected in parallel with each other. The first diode 24 and the second diode 26 are connected in parallel with each other. The emitters of the first switching element 30 and the second switching element 32 are connected to the cathodes of the first diode 24 and the second diode 26. That is, the first switching element 30 and the second switching element 32 connected in parallel with each other and the first diode 24 and the second diode 26 connected in parallel with each other are connected in series.

The first switching element 30 and the second switching element 32 are P-side switching elements connected to the P-side. The first diode 24 and the second diode 26 are N-side diodes connected to the N-side.

Figure 6:
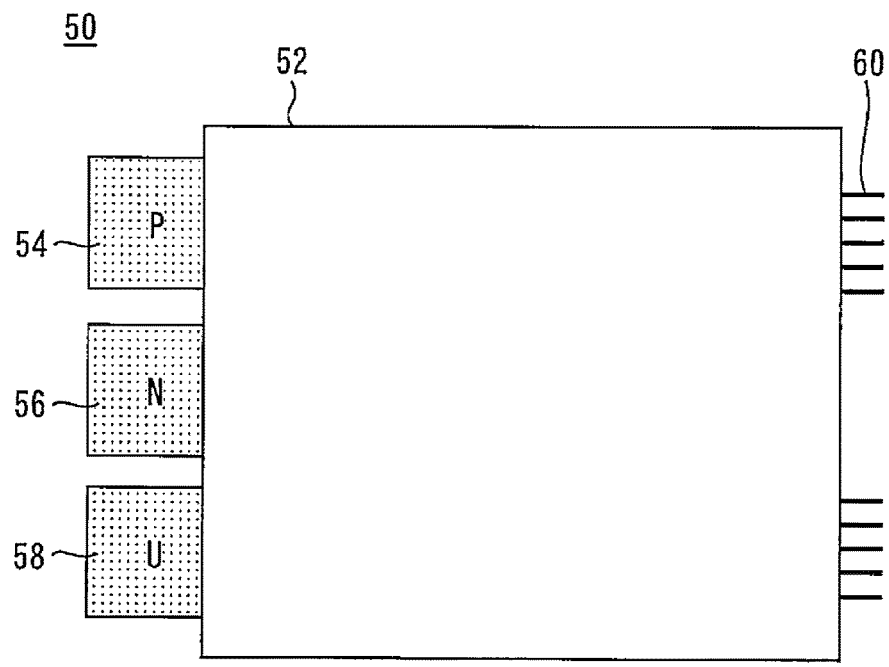
FIG. 6 is a plan view of a semiconductor device.
Figure 7:
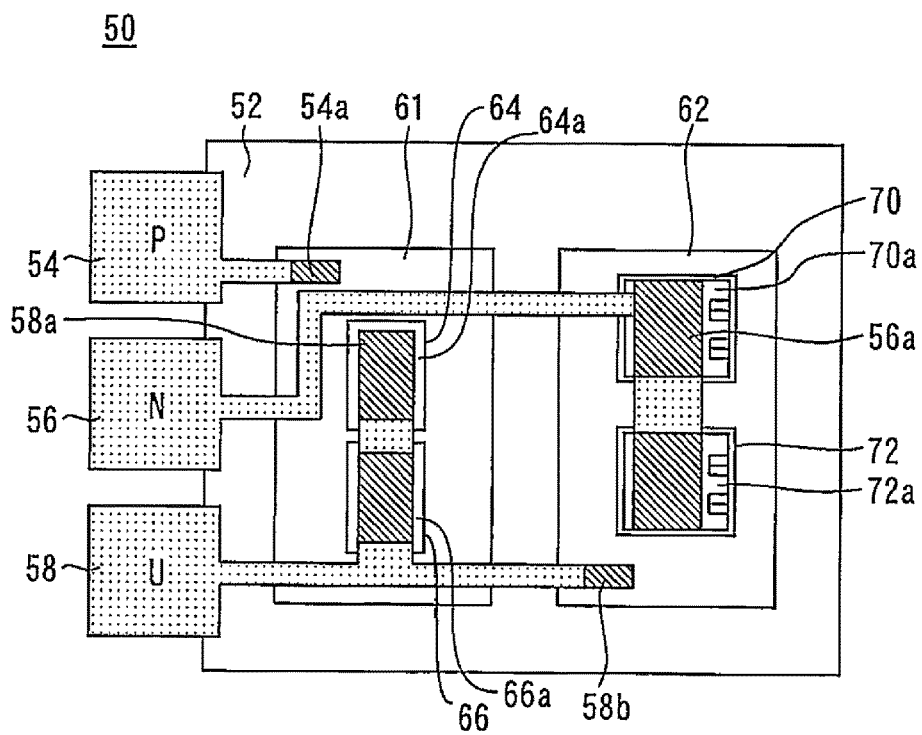
FIG. 7 is a plan view showing portions in the molding resin shown in FIG. 6.

FIG. 6 is a plan view of a semiconductor device 50. The semiconductor device 50 is provided with a molding resin 52. A first terminal 54, a second terminal 56, a third terminal 58 and control terminals 60 are exposed from the molding resin 52 to the outside. FIG. 7 is a plan view showing portions in the molding resin 52 shown in FIG. 6. The semiconductor device 50 includes a first substrate 61 formed of a conductor and a second substrate 62 formed of an electric conductor.

A first diode 64 and a second diode 66 are mounted on the first substrate 61. The structures of the first diode 64 and the second diode 66 and electrical connections of these diodes to the first substrate 61 are the same as the structures of the first diode 24 and the second diode 26 and the electrical connections of these diodes to the first substrate 21. That is, the cathode electrode of the first diode 64 and the cathode electrode of the second diode 66 are electrically connected to the first substrate 61.

A first switching element 70 and a second switching element 72 are mounted on the second substrate 62. The structures of the first switching element 70 and the second switching element 72 and electrical connections of these diodes to the second substrate 62 are the same as the structures of the first switching element 30 and the second switching element 32 and the electrical connections of these diodes to the second substrate 22. That is, the collector electrode of the first switching element 70 and the collector electrode of the second switching element 72 are electrically connected to the substrate 62.

A connection portion 54a, which is a portion of the first terminal 54 formed right above the first substrate 61, is electrically connected to the first substrate 61. A connection portion 56a, which is a portion of the second terminal 56 formed right above the first emitter electrode 70a and the second emitter electrode 72a, is electrically connected to the first emitter electrode 70a and to the second emitter electrode 72a.

A connection portion 58a, which is a portion of the third terminal 58 formed right above the first anode electrode 64a and the second anode electrode 66a, is electrically connected to the first anode electrode 64a and to the second anode electrode 66a. A connection portion 58b, which is a portion of the third terminal 58 formed right above the second substrate 62, is electrically connected to the second substrate 62. Thus, the third terminal 58 is electrically connected to the second substrate 62, the first anode electrode 64a and the second anode electrode 66a.

The molding resin 52 covers the first substrate 61, the first diode 64, the second diode 66, the second substrate 62, the first switching element 70 and the second switching element 72 while exposing portions of the first terminal 54, the second terminal 56 and the third terminal 58 to the outside.

Figure 8:
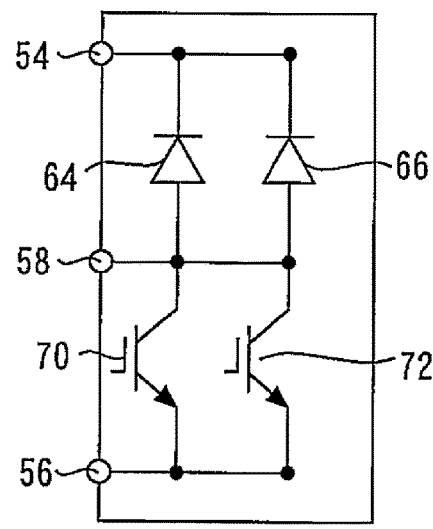
FIG. 8 is a circuit diagram of the semiconductor device.

FIG. 8 is a circuit diagram of the semiconductor device 50. The first diode 64 and the second diode 66 are connected in parallel with each other. The first switching element 70 and the second switching element 72 are connected in parallel with each other. The collectors of the first switching element 70 and the second switching element 72 are connected to the anodes of the first diode 64 and the second diode 66. That is, the first switching elements 70 and the second switching element 72 connected in parallel with each other and the first diode 64 and the second diode 66 connected in parallel with each other are connected in series.

The first diode 64 and the second diode 66 are P-side diodes connected to the P-side. The first switching element 70 and the second switching element 72 are N-side switching elements connected to the N-side.

Figure 9:
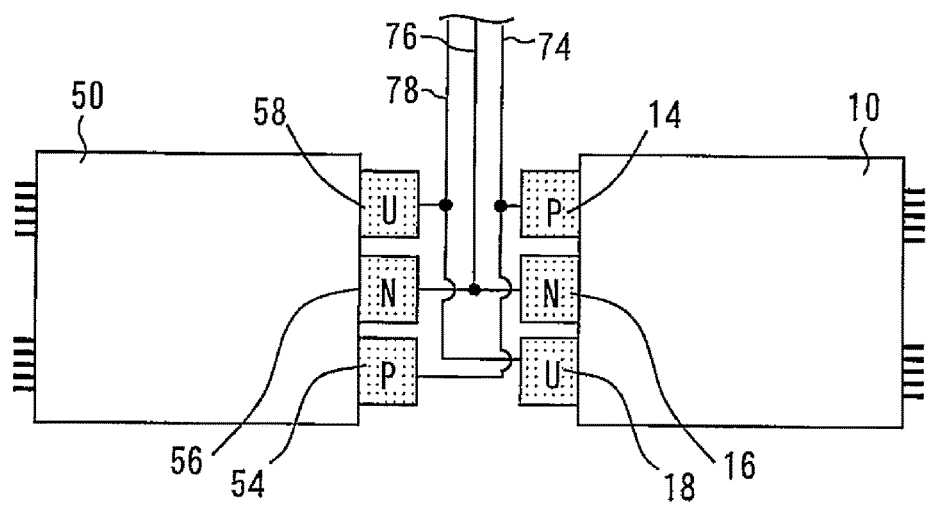
FIG. 9 is a plan view showing a state where the semiconductor devices are connected to bus bar.

A method of using the semiconductor device 10 and the semiconductor device 50 will subsequently be described. The semiconductor device 10 and the semiconductor device 50 are connected so as to form one phase (single phase). FIG. 9 is a plan view showing a state where the semiconductor device 10 and the semiconductor device 50 are connected to each other. The first terminal 14 and the first terminal 54 are connected to a bus bar 74 connected to the P-side. The second terminal 16 and the second terminal 56 are connected to a bus bar 76 connected to the N-side. The third terminal 18 and the third terminal 58 are connected to a bus bar 78 connected to a load.

Figure 10:
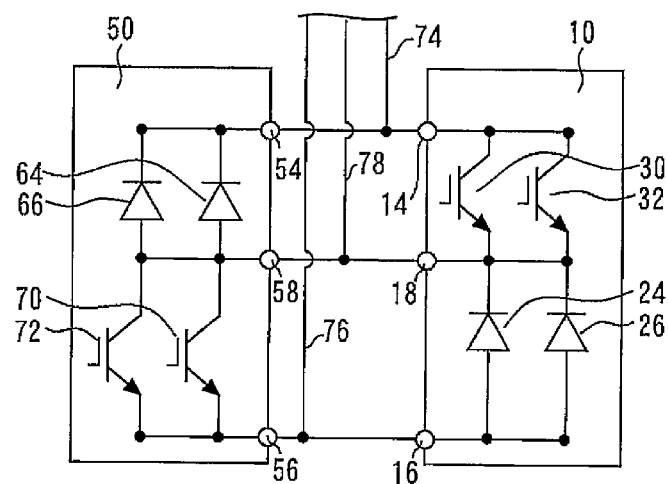
FIG. 10 is a circuit diagram of the semiconductor device shown in FIG. 9.

FIG. 10 is a circuit diagram of the semiconductor device shown in FIG. 9. The first switching element 30, the second switching element 32, the first diode 64 and the second diode 66 form an upper arm. The first switching element 70, the second switching element 72, the first diode 24 and the second diode 26 form a lower arm. The upper arm is capable of increasing the current capacity of the semiconductor device because of the parallel connection of the first switching element 30 and the second switching element 32. The lower arm is capable of increasing the current capacity of the semiconductor device because of the parallel connection of the first switching element 70 and the second switching element 72.

Figure 11:
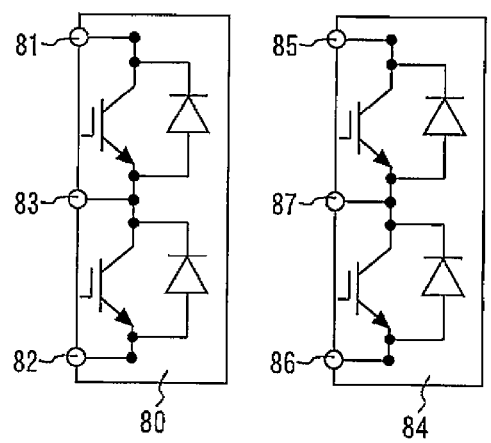
FIG. 11 is a circuit diagram of a semiconductor device according to a first comparative example.

The significance of the semiconductor device according to Embodiment 1 of the present invention will be described while referring to comparative examples. FIG. 11 is a circuit diagram of a semiconductor device according to a first comparative example. A semiconductor device 80 includes one P-side switching element, one P-side diode, one N-side switching element and one N-side diode. The semiconductor device 80 includes a terminal 81 connected to the P-side, a terminal 82 connected to the N-side and a terminal 83 connected to a load.

A semiconductor device 84 is configured in the same way as the semiconductor device 80. The semiconductor device 84 includes a terminal 85 connected to the P-side, a terminal 86 connected to the N-side and a terminal 87 connected to the load.

In the semiconductor device in the first comparative example, the terminal 81 and the terminal 85 are connected to each other, the terminal 82 and the terminal 86 are connected to each other, and the terminal 83 and the terminal 87 are connected to each other, thereby forming one phase with an increased current capacity. In this case, there is a need to reduce variations in characteristics such as Vth and Von of the switching elements in order to limit thermal nonuniformity between the switching elements due to current unbalance. Reducing variations in characteristics of the switching elements requires management of the characteristics of the switching elements for each of manufactured articles. In the case of the first comparative example, therefore, there is a problem that the number of points of management of the characteristics of the semiconductor device is increased.

In the semiconductor device according to Embodiment 1 of the present invention, the first switching element 30 and the second switching element 32, which are P-side switching elements, are thermally connected to each other since the first switching element 30 and the second switching element 32 are fixed on the second substrate 22. Thermal nonuniformity between the first switching element 30 and the second switching element 32 due to current unbalance between the first switching element 30 and the second switching element 32 can therefore be limited. Consequently, the above-described problem that the number of points of management is increased can be avoided.

Figure 12:
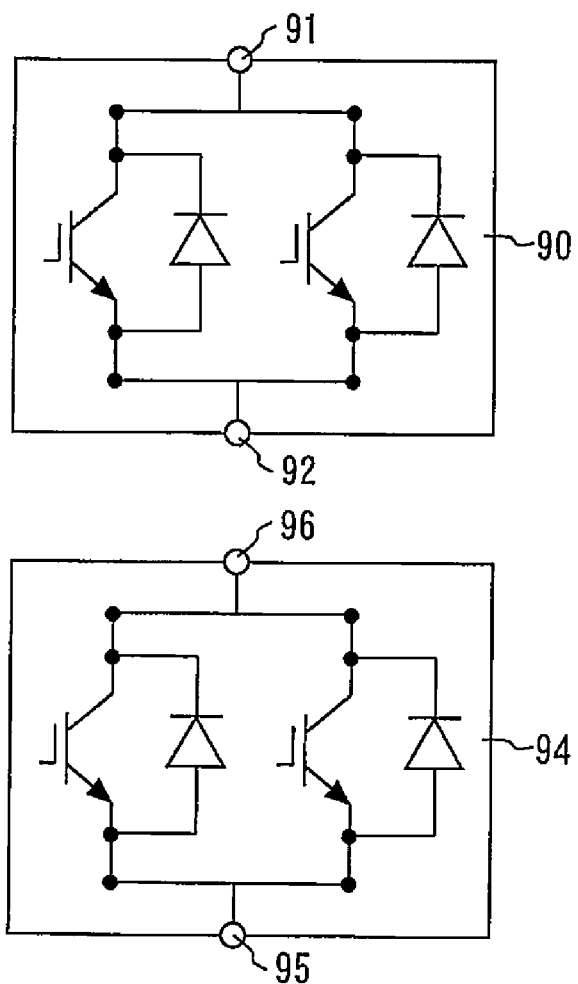
FIG. 12 is a circuit diagram of a semiconductor device according to a second comparative example.

FIG. 12 is a circuit diagram of a semiconductor device according to a second comparative example. A semiconductor device 90 includes two P-side switching elements and two P-side diodes. The semiconductor device 90 includes a terminal 91 connected to the P-side and a terminal 92 connected to a load. A semiconductor device 94 includes two N-side switching elements and two N-side diodes. The semiconductor device 94 includes a terminal 95 connected to the N-side and a terminal 96 connected to the load.

In the semiconductor device in the second comparative example, the terminal 92 and the terminal 96 are connected to form one phase. In this case, the shape of the U-phase bus bar connecting the terminal 92 and the terminal 96 influences the package inductance between the terminal 92 and the terminal 96.

In the semiconductor device 10 according to Embodiment 1 of the present invention, the points of connection at which the first switching element 30 and the second switching element 32 are connected to the first diode 24 and the second diode 26 are provided inside the semiconductor device 10. Also, in the semiconductor device 50, the points of connection at which the first diode 64 and the second diode 66 are connected to the first switching element 70 and the second switching element 72 are provided inside the semiconductor device 50. The semiconductor devices 10 and 50 thus enable limiting the influence of the shape of the U-phase bus bar on the package inductance.

In Embodiment 1 of the present invention, the number of P-side switching elements is two and the number of N-side switching elements is also two. If there is a need to increase the current capacity of the semiconductor device, each of the number of P-side switching elements and the number of N-side switching elements may be set to three or more. Also, the number of P-side switching elements and the number of N-side switching elements may be set at a different value from each other.

Each of the above-described switching elements is not limited to the IGBT. Each switching element may alternatively be, for example, a MOSFET. These modifications can also be applied to semiconductor devices according to embodiments described below. While the semiconductor devices 10 and 50 in Embodiment 1 of the present invention form a single-phase inverter, three single-phase inverters each formed by the semiconductor devices 10 and 50 may be prepared to form a three-phase inverter.

In some cases in the following, for ease of description, a semiconductor device including switching elements forming an upper arm (P-side switching elements) is referred to as a "first semiconductor device" and a semiconductor device including switching elements forming a lower arm (N-side switching elements) is referred to as a "second semiconductor device". In the case of Embodiment 1, the semiconductor device 10 is a first semiconductor device while the semiconductor device 50 is a second semiconductor device.

Embodiment 2

Figure 13:
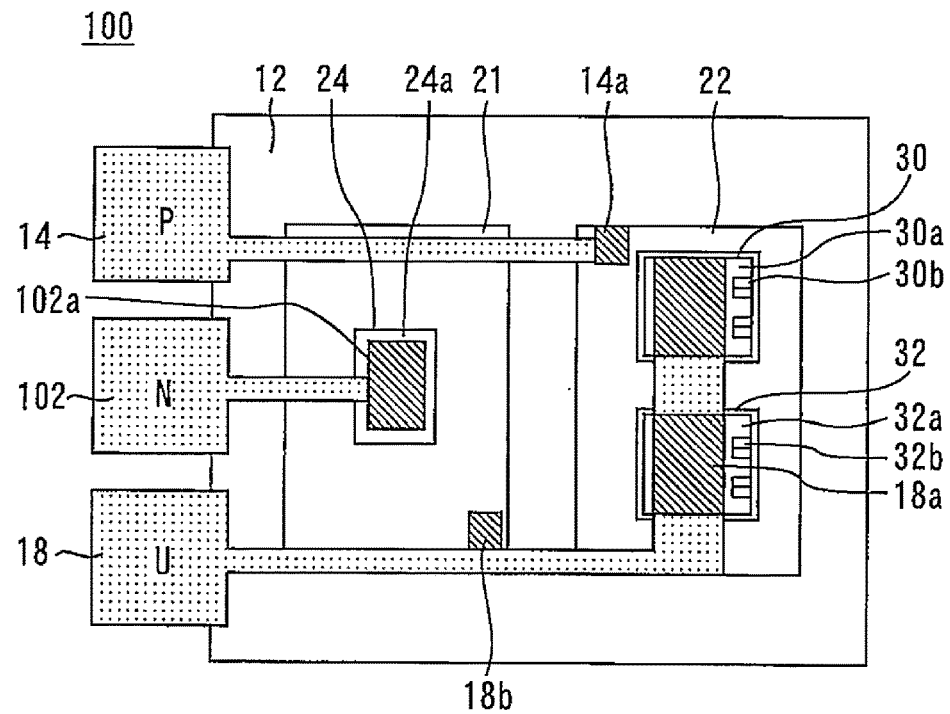
FIG. 13 is a plan view of a semiconductor device according to second embodiment of the present invention showing portions in a resin.
Figure 14:
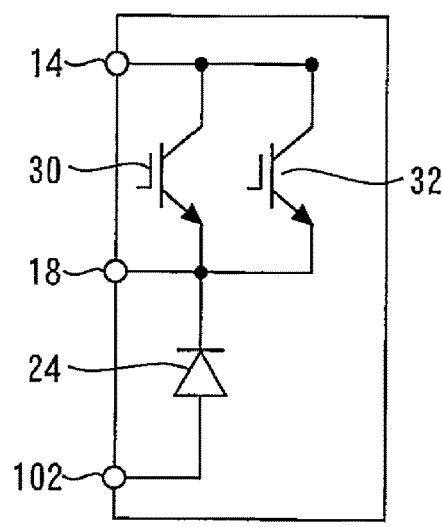
FIG. 14 is a circuit diagram of the semiconductor device shown in FIG. 13.

A first semiconductor device and a second semiconductor device according to Embodiment 2 of the present invention have a number of commonalities with the first semiconductor device (semiconductor device 10) and the second semiconductor device (semiconductor device 50) according to Embodiment 1 and will therefore be described with respect to points of difference from these semiconductor devices. FIG. 13 is a plan view of a semiconductor device 100, which is a first semiconductor device, showing portions in a resin. The semiconductor device 100 is defined by removing the second diode 26 from the semiconductor device 10 shown in FIG. 2. Accordingly, a connection portion 102a of a second terminal 102 is connected only to the first anode electrode 24a. FIG. 14 is a circuit diagram of the semiconductor device 100 shown in FIG. 13.

Figure 15:
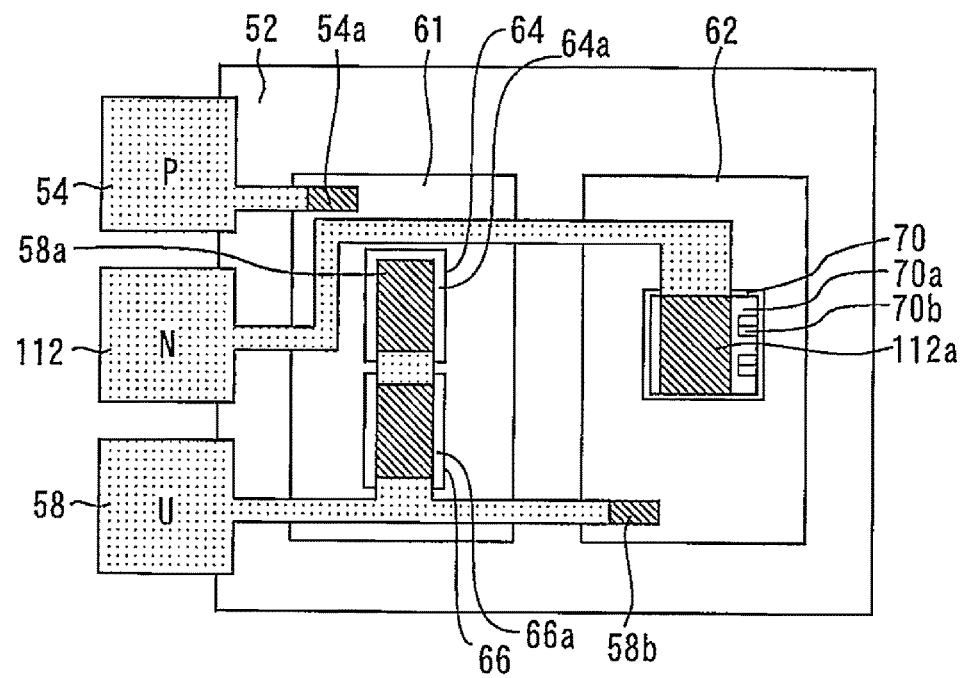
FIG. 15 is a plan view of a semiconductor device showing portions in a resin.
Figure 16:
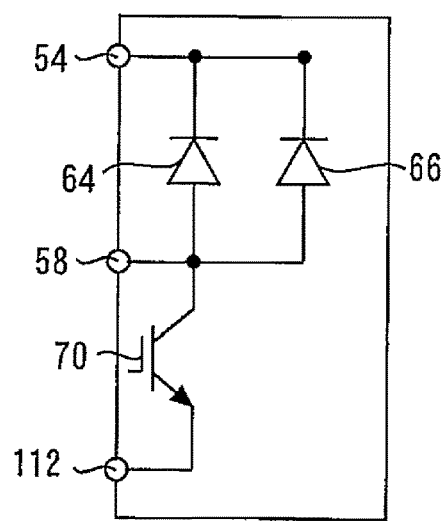
FIG. 16 is a circuit diagram of the semiconductor device shown in FIG. 15.

FIG. 15 is a plan view of a semiconductor device 110, which is a second semiconductor device, showing portions in a resin. The semiconductor device 110 is defined by removing the second switching element 72 from the semiconductor device shown in FIG. 7. Accordingly, a connection portion 112a of a second terminal 112 is connected only to the first emitter electrode 70a. FIG. 16 is a circuit diagram of the semiconductor device 110 shown in FIG. 15.

Figure 17:
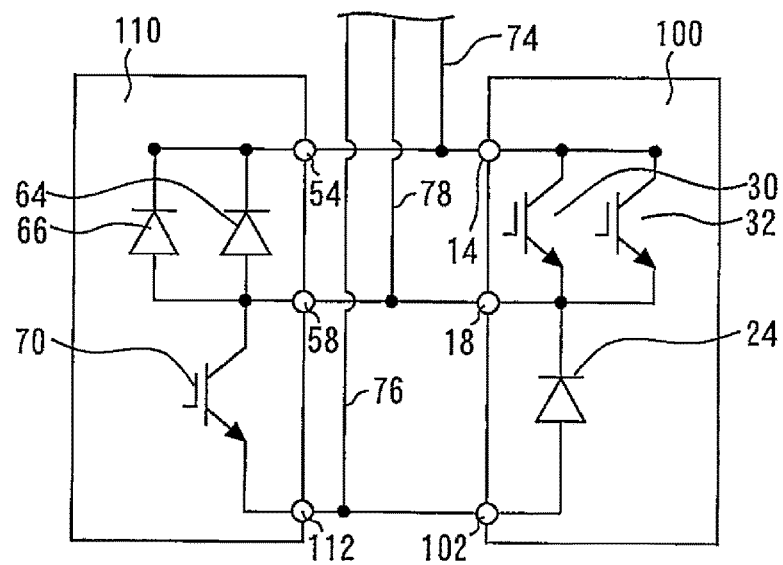
FIG. 17 is a circuit diagram of a semiconductor device connected to the bus bar.

FIG. 17 is a circuit diagram of a semiconductor device formed by connecting the semiconductor device 100 and the semiconductor device 110. The semiconductor device 100 and the semiconductor device 110 are connected so as to form one phase (single phase). The second terminal 102 and the second terminal 112 are connected to the bus bar 76 connected to the N-side. The semiconductor device shown in FIG. 17 includes two P-side switching elements (first switching element 30 and second switching element 32), two P-side diodes (first diode 64 and second diode 66), one N-side switching element (first switching element 70) and one N-side diode (first diode 24).

The semiconductor device according to Embodiment 2 of the present invention has an increased current capacity in the upper arm by means of the two switching elements, and has a reduced current capacity in the lower arm by means of one switching element. This semiconductor device is suitable for application in a case where a high current capacity is required only in the upper arm.

The number of switching elements and the number of diodes can be changed as desired. For example, the current capacities in the upper and lower arms may be increased by setting the number of P-side switching element to three and setting the number of N-side switching elements to two.

Embodiment 3

Figure 18:
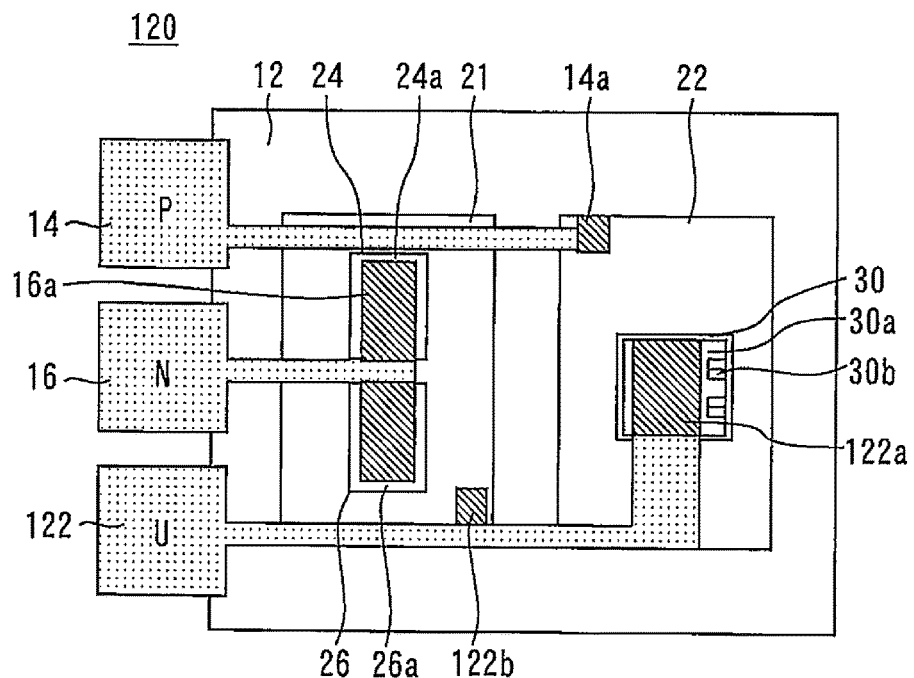
FIG. 18 is a plan view of a semiconductor device according to a third embodiment of the present invention showing portions in a resin.
Figure 19:
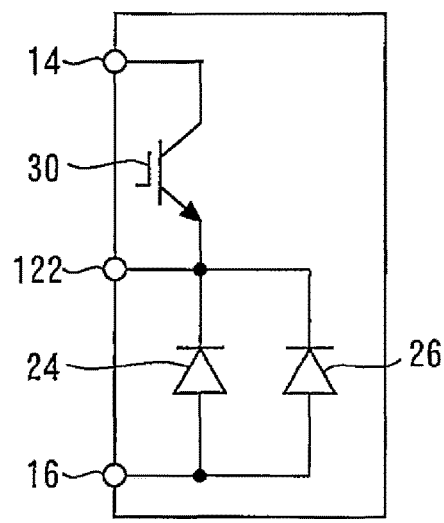
FIG. 19 is a circuit diagram of the semiconductor device shown in FIG. 18.

A first semiconductor device and a second semiconductor device according to Embodiment 3 of the present invention has a number of commonalities with the first semiconductor device (semiconductor device 10) and the second semiconductor device (semiconductor device 50) according to Embodiment 1 and will therefore be described with respect to points of difference from these semiconductor devices. FIG. 18 is a plan view of a semiconductor device 120, which is a first semiconductor device, showing portions in a resin. The semiconductor device 120 is defined by removing the second switching element 32 from the semiconductor device shown in FIG. 2. Accordingly, a connection portion 122b of a third terminal 122 is electrically connected to the first substrate 21, and a connection portion 122a of the third terminal 122 is electrically connected to the first emitter electrode 30a. FIG. 19 is a circuit diagram of the semiconductor device 120 shown in FIG. 18.

Figure 20:
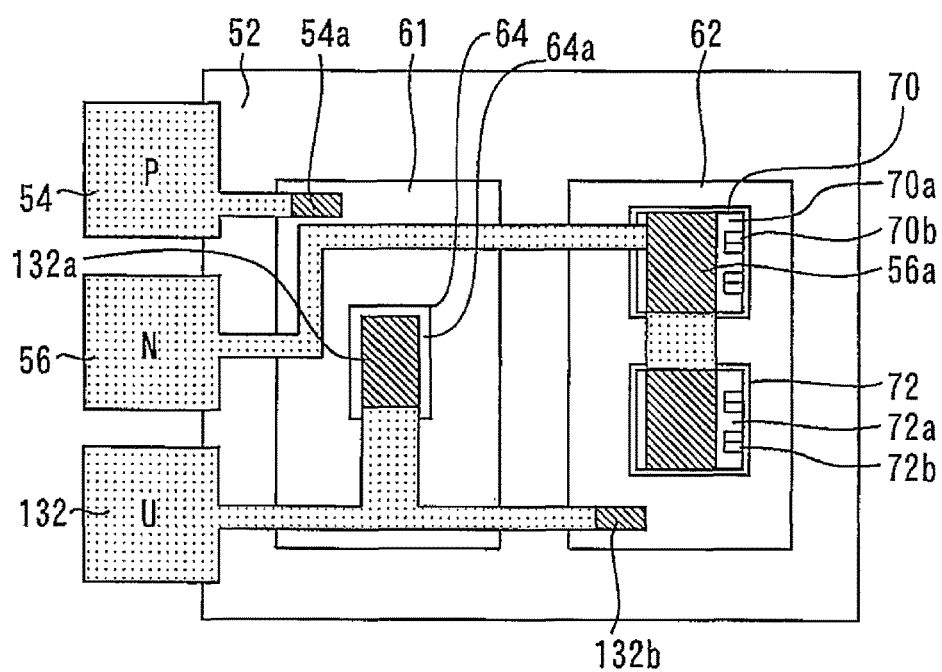
FIG. 20 is a plan view of a semiconductor device showing portions in a resin.
Figure 21:
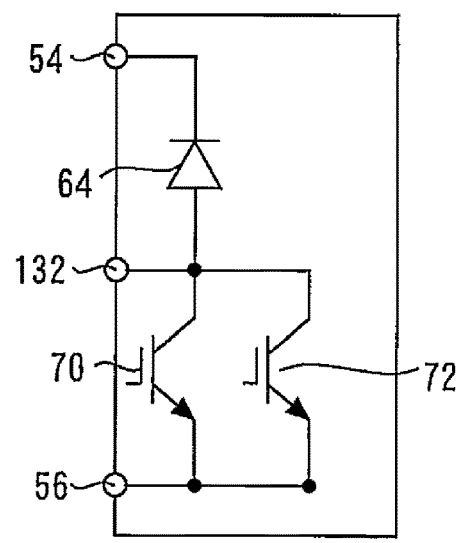
FIG. 21 is a circuit diagram of the semiconductor device shown in FIG. 20.

FIG. 20 is a plan view of a semiconductor device 130, which is a second semiconductor device, showing portions in a resin. The semiconductor device 130 is defined by removing the second diode 66 from the semiconductor device shown in FIG. 7. Accordingly, a connection portion 132a of a third terminal 132 is electrically connected to the first anode electrode 64a, and a connection portion 132b of the third terminal 132 is electrically connected to the second substrate 62. FIG. 21 is a circuit diagram of the semiconductor device 130 shown in FIG. 20.

Figure 22:
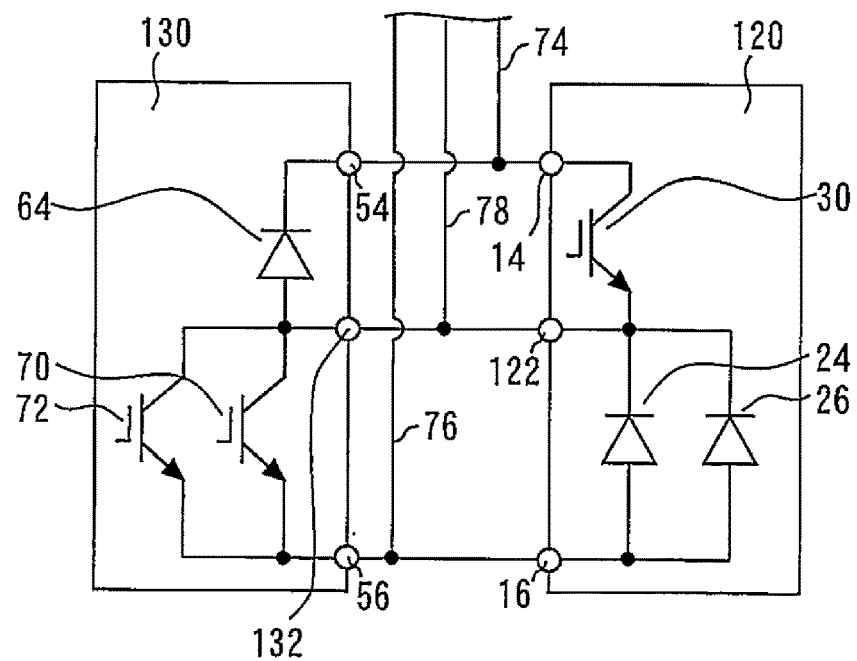
FIG. 22 is a circuit diagram showing a state where the semiconductor devices are connected to bus bar.

FIG. 22 is a circuit diagram showing a state where the semiconductor device 120 and the semiconductor device 130 are connected to each other. The semiconductor device 120 and the semiconductor device 130 are connected so as to form one phase (single phase). The third terminal 122 and the third terminal 132 are connected to the bus bar 78 connected to a load. The semiconductor device shown in FIG. 22 includes one P-side switching element (first switching element 30), one P-side diode (first diode 64), two N-side switching elements (first switching element 70 and second switching element 72) and two N-side diodes (first diode 24 and second diode 26).

The semiconductor device according to Embodiment 3 of the present invention has an increased current capacity in the lower arm by means of the two switching elements, and has a reduced current capacity in the upper arm by means of one switching element. This semiconductor device is suitable for application in a case where a high current capacity is required only in the lower arm.

The number of switching elements and the number of diodes can be changed as desired. For example, the current capacities in the upper and lower arms may be increased by setting the number of P-side switching element to two and setting the number of N-side switching elements to three.

Embodiment 4

Figure 23:
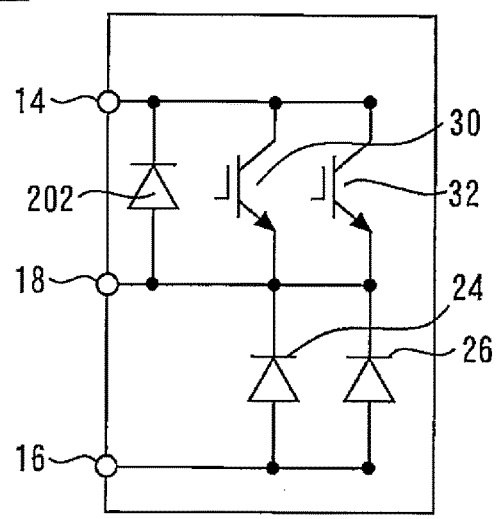
FIG. 23 is a circuit diagram of a semiconductor device according to Embodiment 4 of the present invention.

A semiconductor device according to Embodiment 4 of the present invention has a number of commonalities with the semiconductor device 10 according to Embodiment 1 and will therefore be described with respect to points of difference from the semiconductor device 10. FIG. 23 is a circuit diagram of a semiconductor device 200 according to Embodiment 4 of the present invention. The semiconductor device 200 includes a clamp diode 202 having a comparatively small capacity. The clamp diode 202 has a cathode electrode connected to the first terminal 14 and has an anode electrode connected to the third terminal 18.

Figure 24:
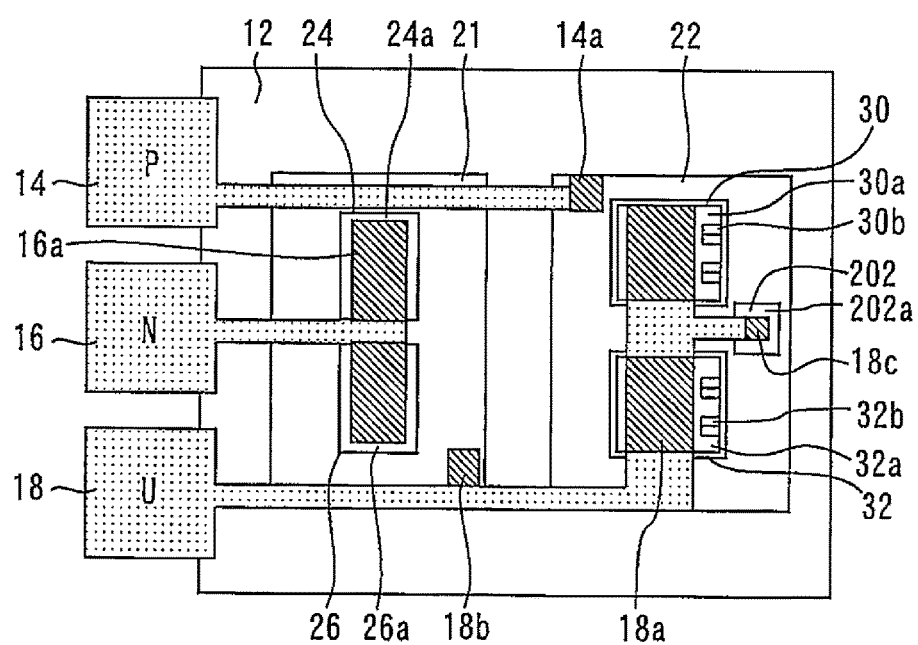
FIG. 24 is a plan view of the semiconductor device showing portions in the molding resin.

FIG. 24 is a plan view of the semiconductor device 200 showing portions in the molding resin 12. The clamp diode 202 has the cathode electrode in its lower surface and has the anode electrode in its upper surface. The cathode electrode of the clamp diode 202 is electrically connected to the second substrate 22, and the anode electrode 202a is electrically connected to a connection portion 18c of the third terminal 18. The provision of the clamp diode 202 enables prevention of degradation of the first switching element 30 and the second switching element 32.

Thus, the connection portion 18c is provided in the third terminal 18 and is connected to the anode electrode 202a of the clamp diode 202, thereby enabling the semiconductor device 200 to be used as a switched reluctance motor (SRM) drive circuit. On the other hand, without the connection portion 18c provided in the third terminal 18, the semiconductor device can be used as an inverter component. That is, the SRM drive circuit and the inverter component can be selectively manufactured by only selecting the terminal shape at the time of manufacturing of the semiconductor device.

Embodiment 5

Figure 25:
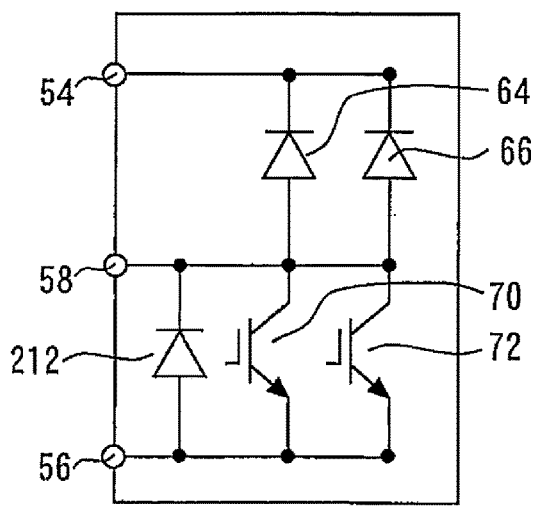
FIG. 25 is a circuit diagram of a semiconductor device according to Embodiment 5 of the present invention.

A semiconductor device according to Embodiment 5 of the present invention has a number of commonalities with the semiconductor device 50 according to Embodiment 1 and will therefore be described with respect to points of difference from the semiconductor device 50. FIG. 25 is a circuit diagram of a semiconductor device 210 according to Embodiment 5 of the present invention. The semiconductor device 210 includes a clamp diode 212 having a comparatively small capacity. The clamp diode 212 has a cathode electrode connected to the third terminal 58 and has an anode electrode connected to the second terminal 56.

Figure 26:
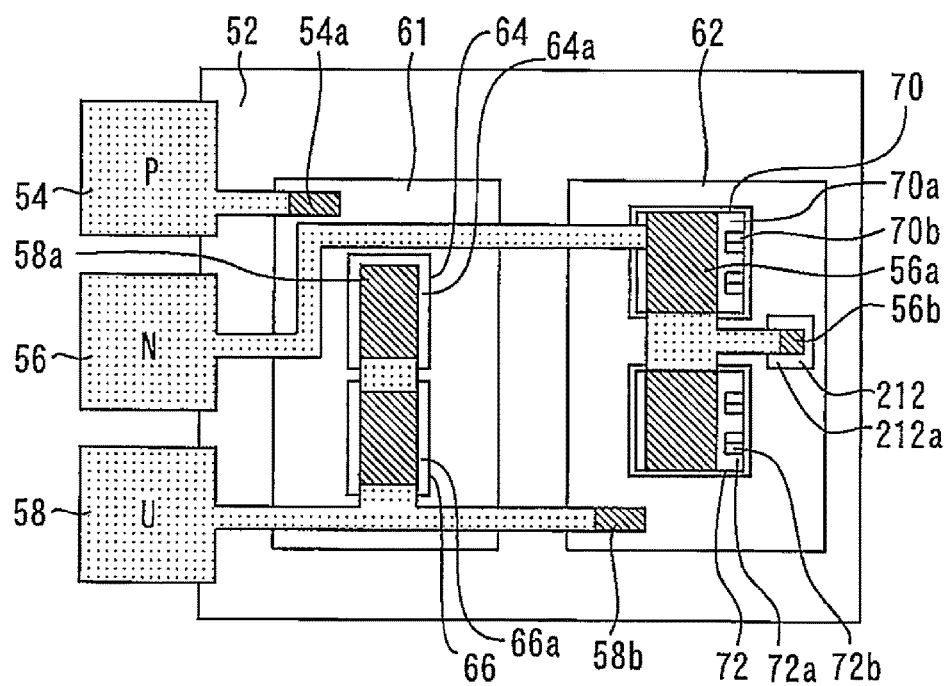
FIG. 26 is a plan view of the semiconductor device shown in FIG. 25 showing portions in a molding resin.

FIG. 26 is a plan view of the semiconductor device 210 showing portions in a molding resin 52. The cathode electrode of the clamp diode 212 is electrically connected to the second substrate 22, and the anode electrode 212a is electrically connected to a connection portion 56b of the second terminal 56. The provision of the clamp diode 212 enables prevention of degradation of the first switching element 70 and the second switching element 72. Also, an SRM drive circuit or an inverter component can be manufactured according to the existence/nonexistence of the connection portion 56b.

Embodiment 6

Figure 27:
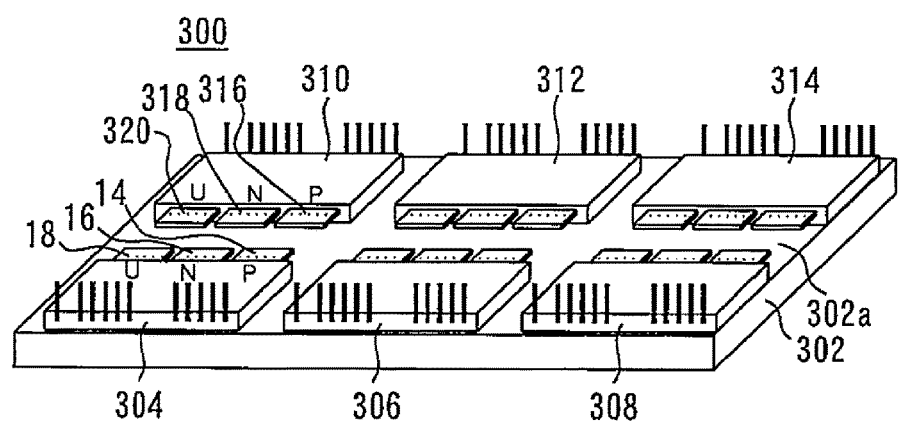
FIG. 27 is a perspective view of a semiconductor device according to Embodiment 6 of the present invention.

FIG. 27 is a perspective view of a semiconductor device according to Embodiment 6 of the present invention. A semiconductor device 300 has a cooling device 302. First semiconductor devices 304, 306, and 308 and second semiconductor devices 310, 312, and 314 are mounted on a main surface 302a of the cooling device 302. Each of the first semiconductor devices 304, 306, and 308 has the same configuration as that of the semiconductor device 10 according to Embodiment 1. Accordingly, the first semiconductor device 304 includes the first terminal 14 provided on the right-hand side and connected to the P-side, the second terminal 16 provided at a center and connected to the N-side, and the third terminal 18 provided on the left-hand side and connected to a load.

Figure 28:
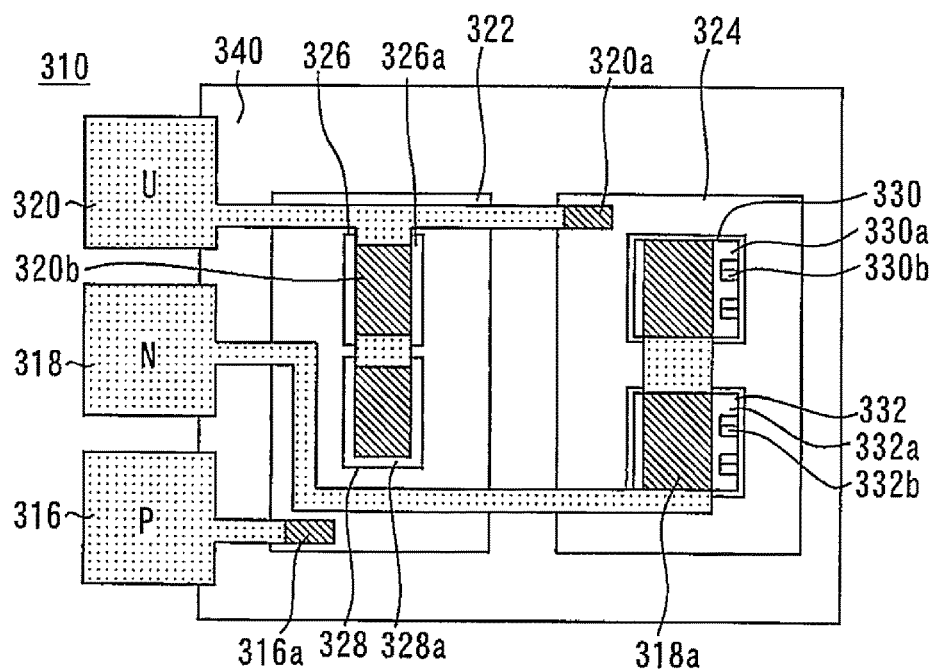
FIG. 28 is a plan view of the second semiconductor device showing portions in a molding resin.

The second semiconductor device 310 includes a fourth terminal 316 on the right-hand side, a fifth terminal 318 at a center and a sixth terminal 320 on the left-hand side. The fourth terminal 316 is connected to the P-side, the fifth terminal 318 to the N-side, and the sixth terminal 320 to the load. The second semiconductor devices 312 and 314 also have the same terminal array. FIG. 28 is a plan view of the second semiconductor device 310 showing portions in a molding resin. The second semiconductor device 310 includes a third substrate 322 formed of an electric conductor and a fourth substrate 324 formed of an electric conductor.

A third diode 326 and a fourth diode 328 are mounted on the third substrate 322. A third cathode electrode formed in a lower surface of the third diode 326 is electrically connected to the third substrate 322. A fourth cathode electrode formed in a lower surface of the fourth diode 328 is electrically connected to the third substrate 322.

A third switching element 330 and a fourth switching element 332 are mounted on the fourth substrate 324. The third switching element 330 has a third emitter electrode 330a and a third gate electrode 330b on its upper surface side and has a third collector electrode on its lower surface side. The third collector electrode is electrically connected to the fourth substrate 324. The fourth switching element 332 has a fourth emitter electrode 332a and a fourth gate electrode 332b on its upper surface side and has a fourth collector electrode on its lower surface side. The fourth collector electrode is electrically connected to the fourth substrate 324.

A connection portion 316a of the fourth terminal 316 is electrically connected to the third substrate 322. A connection portion 318a of the fifth terminal 318 is electrically connected to the third emitter electrode 330a and to the fourth emitter electrode 332a. A connection portion 320a of the sixth terminal 320 is electrically connected to the fourth substrate 324. A connection portion 320b of the sixth terminal 320 is electrically connected to a third anode electrode 326a and a fourth anode electrode 328a.

A molding resin 340 covers the third substrate 322, the third diode 326, the fourth diode 328, the fourth substrate 324, the third switching element 330 and the fourth switching element 332 while exposing portions of the fourth terminal 316, the fifth terminal 318 and the sixth terminal 320 to the outside. The second semiconductor devices 312 and 314 each have the same configuration as the second semiconductor device 310.

The semiconductor device shown in FIG. 27 has bus bars connected to the terminals to form a three-phase inverter circuit. The first terminal 14 is correctly opposed to the fourth terminal 316, the second terminal 16 to the fifth terminal 318, and the third terminal 18 to the sixth terminal 320. Therefore, connection can easily be established between the first terminal 14 and the fourth terminal 316, between the second terminal 16 and the fifth terminal 318 and between the third terminal 18 and the sixth terminal 320.

In the semiconductor device according to Embodiment 6 of the present invention, each pair of terminals to be connected to each other are correctly opposed to improve the facility with which connection is made between the terminals, while an effect of "limiting the increase in number of points of management" and an effect of "stabilizing the inductance" are obtained. The semiconductor device according to Embodiment 6 of the present invention can be variously modified in such a scope as not to lose this feature. For example, the arrangement is not limited to forming a three-phase inverter circuit of the six semiconductor devices. Two semiconductor devices may form a single-phase inverter circuit, and four semiconductor devices may form a bridge circuit.

The arrangement may be such that three semiconductor devices 100 each identical to the one shown in FIG. 14 are used as three first semiconductor devices, while three semiconductor devices 110 each identical to the one shown in FIG. 16 are used as three second semiconductor devices. In such a case, the first switching element, the second switching element and the first diode are formed in the first semiconductor device, while the third switching element, the second diode and the third diode are formed in the second semiconductor device. In this way, a semiconductor device in which the current capacity is increased in the upper arm in comparison with that in the lower arm can be obtained.

The arrangement may be such that three semiconductor devices 120 each identical to the one shown in FIG. 19 are used as three first semiconductor devices, while three semiconductor devices 130 each identical to the one shown in FIG. 21 are used as three second semiconductor devices. In such a case, the first switching element, the first diode and the second diode are formed in the first semiconductor device, while the second switching element, the third switching element and the third diode are formed in the second semiconductor device. In this way, a semiconductor device in which the current capacity is increased in the lower arm in comparison with that in the upper arm can be obtained.

Figure 29:
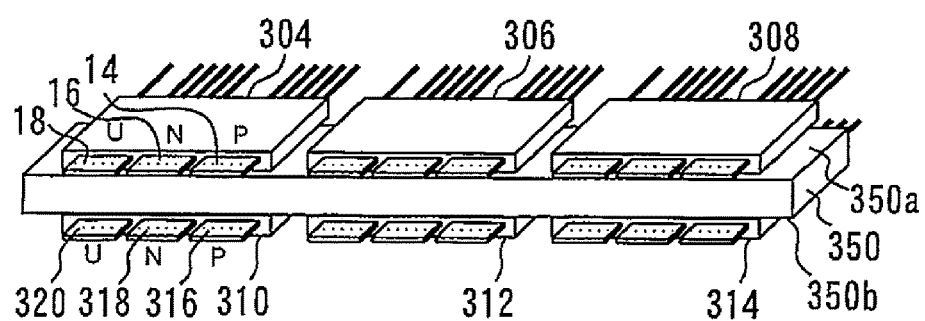
FIG. 29 is a perspective view of a semiconductor device according to a modified example.

FIG. 29 is a perspective view of a semiconductor device according to a modified example. Three first semiconductor devices 304, 306, and 308 are mounted on an upper surface 350a of a cooling device 350. Three second semiconductor devices 310, 312, and 314 are mounted on a lower surface 350b of the cooling device 350. The semiconductor devices are fixed both on the upper surface 350a and on the lower surface 350b of the cooling device 350, thus enabling the three-phase inverter circuit to be reduced in size.

Pin fins may be formed on a portion of the above-described cooling devices 302 or 350. A combination of the features of the semiconductor devices according to the embodiments described above can be made as desired.

DESCRIPTION OF SYMBOLS 10,50 semiconductor device, 12,52 molding resin, 14,54 first terminal, 16,56 second terminal, 18,58 third terminal, 20,60 control terminal, 21,61 first substrate, 22,62 second substrate, 24,64 first diode, 24a,64a first anode electrode, 24c first cathode electrode, 26, 66 second diode, 26a,66a second anode electrode, 26c second cathode electrode, 27,28,33,34 electroconductive adhesive, 30,70 first switching element, 30a,70a first emitter electrode, 30b first gate electrode, 30d first collector electrode, 32,72 second switching element, 32a,72a second emitter electrode, 32b second gate electrode, 32d second collector electrode, 74,76,78 bus bar, 202,212 clamp diode, 302,350 cooling device, 302a main surface, 350a upper surface, 350b lower surface, 326 third diode, 328 fourth diode, 330 third switching element, 332 fourth switching element

The invention claimed is:

1. A semiconductor device comprising:
a first substrate formed of an electric conductor;
a first diode having a first cathode electrode and a first anode electrode, the first cathode electrode being directly connected to the first substrate;
a second substrate formed of an electric conductor;
a first switching element having a first emitter electrode, a first collector electrode and a first gate electrode, the first collector electrode being directly connected to the second substrate via a first electroconductive adhesive;
a second switching element having a second emitter electrode, a second collector electrode and a second gate electrode, the second collector electrode being directly connected to the second substrate;
a first terminal directly connected to the second substrate;
a second terminal directly connected to the first anode electrode;
a third terminal directly connected to the first emitter electrode via a first connection portion of the third terminal and a second electroconductive adhesive, the second emitter electrode via a second connection portion of the third terminal and a third electroconductive adhesive and the first substrate; and
a molding resin covering the first substrate, the first diode, the second substrate, the first switching element and the second switching element while exposing portions of the first terminal, the second terminal and the third terminal to the outside,
wherein the first and second switching elements are formed over the second substrate.

2. The semiconductor device according to claim 1, further comprising a second diode having a second cathode electrode and a second anode electrode, the second cathode electrode being electrically connected to the first substrate, the second anode electrode being electrically connected to the second terminal,
wherein the molding resin covers the second diode.

3. The semiconductor device according to claim 1, further comprising a clamp diode having a cathode electrode and an anode electrode, the cathode electrode being electrically connected to the second substrate, the anode electrode being electrically connected to the third terminal.

4. A semiconductor device comprising:
a first substrate formed of an electric conductor;
a first diode having a first cathode electrode and a first anode electrode, the first cathode electrode being directly connected to the first substrate;
a second diode having a second cathode electrode and a second anode electrode, the second cathode electrode being directly connected to the first substrate;
a second substrate formed of an electric conductor;
a first switching element having a first emitter electrode, a first collector electrode and a first gate electrode, the first collector electrode being directly connected to the second substrate via a first electroconductive adhesive;
a first terminal directly connected to the second substrate;
a second terminal directly connected to the first anode electrode and the second anode electrode;
a third terminal directly connected to the first emitter electrode via a connection portion of the third terminal and a second electroconductive adhesive and the first substrate; and
a molding resin covering the first substrate, the first diode, the second diode, the second substrate and the first switching element while exposing portions of the first terminal, the second terminal and the third terminal to the outside,
wherein the first and second diodes are formed over the first substrate.

5. A semiconductor device comprising:
a first semiconductor device including:
a first substrate formed of an electric conductor;
a first diode having a first cathode electrode and a first anode electrode, the first cathode electrode being directly connected to the first substrate;
a second substrate formed of an electric conductor;
a first switching element having a first emitter electrode, a first collector electrode and a first gate electrode, the first collector electrode being directly connected to the second substrate via a first electroconductive adhesive;
a second switching element having a second emitter electrode, a second collector electrode and a second gate electrode, the second collector electrode being directly connected to the second substrate;
a first terminal directly connected to the second substrate;
a second terminal directly connected to the first anode electrode;
a third terminal directly connected to the first emitter electrode via a first connection portion of the third terminal and a second electroconductive adhesive, the second emitter electrode via a second connection portion of the third terminal and a third electroconductive adhesive and the first substrate; and
a molding resin covering the first substrate, the first diode, the second substrate, the first switching element and the second switching element while exposing portions of the first terminal, the second terminal and the third terminal to the outside; and
a second semiconductor device including:
a third substrate formed of an electric conductor;
a third diode having a third cathode electrode and a third anode electrode, the third cathode electrode being directly connected to the third substrate;
a fourth diode having a fourth cathode electrode and a fourth anode electrode, the fourth cathode electrode being directly connected to the third substrate;
a fourth substrate formed of an electric conductor;
a third switching element having a third emitter electrode, a third collector electrode and a third gate electrode, the third collector electrode being directly connected to the fourth substrate;
a fourth terminal directly connected to the third substrate;
a fifth terminal directly connected to the third emitter electrode;
a sixth terminal directly connected to the fourth substrate, the third anode electrode and the fourth anode electrode; and
a molding resin covering the third substrate, the third diode, the fourth diode, the fourth substrate and the third switching element while exposing portions of the fourth terminal, the fifth terminal and the sixth terminal to the outside; and
a cooling device on which the first semiconductor device and the second semiconductor device are mounted,
wherein the first terminal is correctly opposed so as to face the fourth terminal;
the second terminal is correctly opposed so as to face the fifth terminal; and
the third terminal is correctly opposed so as to face the sixth terminal.

6. A semiconductor device comprising:
a first semiconductor device including:
a first substrate formed of an electric conductor;
a first diode having a first cathode electrode and a first anode electrode, the first cathode electrode being directly connected to the first substrate;
a second diode having a second cathode electrode and a second anode electrode, the second cathode electrode being directly connected to the first substrate;
a second substrate formed of an electric conductor;
a first switching element having a first emitter electrode, a first collector electrode and a first gate electrode, the first collector electrode being directly connected to the second substrate via a first electroconductive adhesive;
a first terminal directly connected to the second substrate;
a second terminal directly connected to the first anode electrode and the second anode electrode;
a third terminal directly connected to the first emitter electrode via a connection portion of the third terminal and a second electroconductive adhesive and the first substrate; and
a molding resin covering the first substrate, the first diode, the second diode, the second substrate and the first switching element while exposing portions of the first terminal, the second terminal and the third terminal to the outside; and
a second semiconductor device including:
a third substrate formed of an electric conductor;
a third diode having a third cathode electrode and a third anode electrode, the third cathode electrode being directly connected to the third substrate;
a fourth substrate formed of an electric conductor;
a second switching element having a second emitter electrode, a second collector electrode and a second gate electrode, the second collector electrode being directly connected to the fourth substrate;
a third switching element having a third emitter electrode, a third collector electrode and a third gate electrode, the third collector electrode being directly connected to the fourth substrate;

a fourth terminal directly connected to the third substrate;
a fifth terminal directly connected to the second emitter electrode and the third emitter electrode;
a sixth terminal directly connected to the fourth substrate and the third anode electrode; and
a molding resin covering the third substrate, the third diode, the fourth substrate, the second switching element and the third switching element while exposing portions of the fourth terminal, the fifth terminal and the sixth terminal to the outside; and
a cooling device on which the first semiconductor device and the second semiconductor device are mounted,
wherein the first terminal is correctly opposed so as to face the fourth terminal;
the second terminal is correctly opposed so as to face the fifth terminal; and
the third terminal is correctly opposed so as to face the sixth terminal.

\* \* \* \* \*